(12) United States Patent
Summers

(10) Patent No.: US 6,181,526 B1
(45) Date of Patent: Jan. 30, 2001

(54) SUSPENSION WITH FLEXIBLE CIRCUIT WELDED THERETO VIA METAL PADS

(75) Inventor: Robert N. Summers, Temecula, CA (US)

(73) Assignee: Magnecomp Corp., Temecula, CA (US)

(*) Notice: Under 35 U.S.C. 154(b), the term of this patent shall be extended for 0 days.

(21) Appl. No.: 09/207,291

(22) Filed: Dec. 8, 1998

Related U.S. Application Data

(60) Provisional application No. 60/070,599, filed on Jan. 6, 1998.

(51) Int. Cl.$^7$ ........................................................ G11B 5/48
(52) U.S. Cl. ........................................................... 360/245.9
(58) Field of Search ................................ 360/245.9, 246, 360/245.8, 244.3

(56) References Cited

U.S. PATENT DOCUMENTS

| 5,491,597 | * | 2/1996 | Bennin et al. . |
| 5,687,479 | * | 11/1997 | Bennin et al. . |
| 5,712,749 | * | 1/1998 | Gustafson . |
| 5,995,329 | * | 11/1999 | Shiraishi et al. . |

* cited by examiner

Primary Examiner—Craig A. Renner
(74) Attorney, Agent, or Firm—Louis J. Bachand

(57) ABSTRACT

Flexible circuit having a laminated metal base layer is laser welded to a locus of weld attachment defined by the load beam and/or the flexure of a disk drive suspension by use of a selected portion of the base layer, the balance of the base layer having been removed, to achieve a weld attachment and avoid use of resinous adhesives and their outgassing problems.

20 Claims, 3 Drawing Sheets

SUSPENSION WITH FLEXIBLE CIRCUIT WELDED THERETO VIA METAL PADS

RELATED APPLICATIONS

This application claims the benefit of U.S. Provisional Application Ser. No. 60/070,599 filed Jan. 6, 1998.

BACKGROUND OF THE INVENTION

1. Field of the Invention

This invention relates to disk drive suspensions of the type having a load beam and flexure combination for supporting a read-write head carrying slider in operating proximity to a disk. In such suspensions a flexible circuit electrical connector may be used to form the electrical connection between the slider and the read-write circuitry beyond the load beam. While a typical flexible circuit connector comprises multiple conductors within an insulating encapsulant, in the present invention the multiple conductors within the resin encapsulant are referred to as a conductive layer, and this conductive layer is laminated to a metal base layer, typically a stainless steel band that may be attached to the flexible circuit to add body to the flexible circuit and for other purposes. The metal band-laminated flexible circuit will be referred to herein as a laminated flexible circuit or laminated flexible circuit connector when a distinction is being made from flexible circuit having no laminated base layer.

2. Related Art

Flexible circuit electrical connector has been supported on load beam-flexure combinations by adhesive attachment at distributed locations. The use of adhesives in electronic assembly is sometimes problematical, however, as outgassing of resin constituents may occur in use with adverse effects on operation of the device incorporating the assembly. Flexible circuit laminated with stainless backing is known and used in suspensions in circumstances where the greater stiffness of the laminate is acceptable. Such laminates have been fixed in place with adhesives, also, and thus there remains the need to provide suspensions that are capable of being welded in place, i.e. held without the use of adhesives, when using flexible circuit type conductors.

SUMMARY OF THE INVENTION

It is an object therefore to provide an improved disk drive suspension. It is another object to provide a disk drive suspension using flexible circuit electrical connector. It is a further object to provide a suspension in which flexible circuit is welded to the suspension load beam and/or flexure rather than adhered with synthetic organic resin adhesive, so as to avoid potential outgassing problems. Still another object is to provide a modified flexible circuit electrical connector with minimum base layer for minimum stiffness. It is yet another object to provide for weld-attachment of a flexible circuit by using a laminated metal band base layer as the source of weld material; substantially the balance of the band being removed in preferred modes of the invention. A further object comprises arranging the disposition and configuration of laminated flexible circuit electrical connector on a load beam and flexure combination such that welding of the flexible circuit to the load beam or flexure is achievable from either side of the combination, and particularly from the flexible circuit-bearing side of the combination.

These and other objects of the invention are realized in a disk drive suspension comprising a load beam, a flexure attached to the load beam for carrying a slider in operating proximity to a disk, and a laminated flexible circuit electrical connector comprising a conductive layer having a plurality of conductors encapsulated with insulating resin and a metal band base layer to which the conductive layer is laminated, the load beam defining a locus of weld-attachment to the electrical connector, the electrical connector metal band base layer being reduced to a portion dimensioned to be opposite only the weld attachment locus and substantially coextensive only therewith for weld attachment of the electrical connector to the load beam by welding the base band portion laminated to the encapsulated conductors to the load beam, substantially the balance of the electrical connector being free of the metal band base layer.

In this and like embodiments, typically, the load beam has a reduced cross-section at the locus of weld attachment in laser welding facilitating relation, the electrical connector defines a port for cooling gas delivery proximate to the weld attachment locus, and the electrical connector is welded to the load beam at the weld attachment locus.

In a further embodiment, the invention provides a disk drive suspension comprising a load beam, a flexure attached to the load beam for carrying a slider in operating proximity to a disk, and a laminated flexible circuit electrical connector comprising a conductive layer having a plurality of conductors encapsulated with insulating resin and a metal band base layer to which the conductive layer is laminated, the flexure defining a locus of weld-attachment to the electrical connector, the electrical connector metal band base layer being reduced to a portion dimensioned to be opposite only the weld attachment locus and substantially coextensive only therewith for weld attachment of the electrical connector to the load beam by welding the metal base band portion laminated to the encapsulated conductors to the load beam, substantially the balance of the electrical connector being free of the metal base band layer.

In this and like embodiments, typically, the electrical connector defines a port for cooling gas delivery proximate to the weld attachment locus, the load beam has a reduced cross-section at the locus of weld attachment in laser welding facilitating relation, the electrical connector is welded to the load beam at the weld attachment locus.

In a further embodiment, the invention provides a disk drive suspension comprising a load beam, a flexure attached to the load beam for carrying a slider in operating proximity to a disk, and a laminated flexible circuit electrical connector comprising a conductive layer having a plurality of conductors encapsulated with insulating resin and a metal band base layer to which the conductive layer is laminated, the load beam and the flexure each defining a locus of weld-attachment to the electrical connector, the electrical connector metal band base layer being reduced to portions dimensioned to be opposite only each the weld attachment locus and substantially coextensive only therewith for weld attachment of the electrical connector to the load beam and flexure by welding the base band portion laminated to the encapsulating conductors to the load beam, substantially the balance of the electrical connector being free of the metal band base layer.

In this and like embodiments, typically, the electrical connector conductive layer insulating resin encapsulant is locally apertured adjacent the metal band base layer portion freely of interruption of the conductors and their insulating resin encapsulation, the locally apertured insulating resin encapsulant defines a port for cooling gas delivery proximate to each the weld attachment locus, the electrical connector is welded to the load beam at the weld attachment locus, the area of the electrical connector metal band base layer is not more than five times the area of the weld between the metal band base layer and the load beam or flexure at the locus for weld attachment, the load beam has a reduced cross-section at the locus of weld attachment in laser welding facilitating relation, the load beam reduced cross section is defined by a surface recess in the load beam, the load beam recess opens toward and receives the metal band base layer portion for weld attachment to the load beam, or the load beam recess opens away from the metal band base layer portion.

In a still further embodiment, the invention provides a load beam and flexure combination with a flexible circuit, the flexible circuit having a laminated pad of metal band base layer dimensioned for welding to a load beam or flexure, the flexible circuit being weld-attached to either or both of the load beam and the flexure, the pad area not exceeding five times the area of the weld.

In this and like embodiments, typically, the flexure has laterally projecting tabs, the tabs supporting the flexible circuit in weld-attached relation, the load beam and the flexure tabs define plural weld-attachment loci, the flexible circuit comprises a conductive layer of multiple conductors encapsulated in an insulating resin laminated to the metal layer pads, the metal layer pads being located opposite the weld-attachment loci in laser-weldable relation, and the flexible circuit along the length of the flexure is free of metal layer laminate other than at the loci of weld attachment.

In its method aspects, the invention provides a method of manufacturing disk drive suspensions including attaching conductors to the suspension load beam by juxtaposing a laminated flexible circuit comprising a conductive layer having conductors encapsulated in insulating resin and a metal band base layer with a load beam, a flexure, or both a flexure and a load beam, each having a locus for weld attachment, selecting from the metal band base layer a portion dimensioned for weld-attaching the flexible circuit to the load beam and/or flexure, removing substantially the remainder of the metal band base layer from the flexible circuit, and laser welding the metal band base layer portion to the load beam, flexure or both.

In this and like embodiments, typically, there is included effecting the laser welding through the metal band base layer portion to the load beam locus of weld attachment, relieving the load beam thickness at its the locus of weld attachment, and during laser welding directing cooling gases toward the locus of weld attachment, and further juxtaposing the flexible circuit with a flexure having a further locus of weld attachment, selecting a further portion of the metal band base layer, and laser-welding the flexible circuit metal band base layer further portion to the flexure at the further locus of weld attachment.

THE DRAWINGS

The invention will be further described in conjunction with the attached drawings in which.

DETAILED DESCRIPTION

Figure 1:
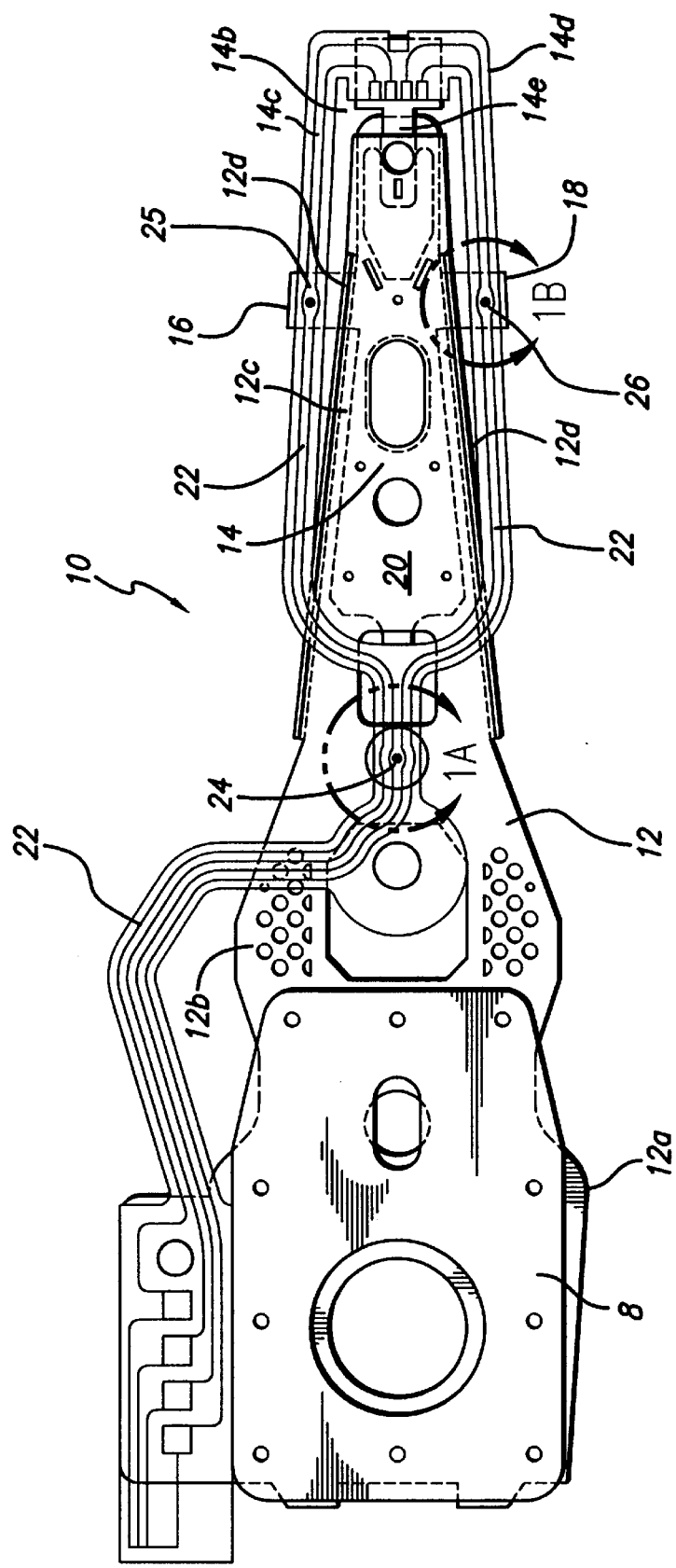
FIG. 1 is a plan view of a disk drive suspension according to the invention, viewed from the slider bearing side.

The present invention enables the easy welding of flexible circuit electrical connector to the load beam and flexure suspension components. By having and utilizing a metal band layer laminated to the plastic encapsulated conductors of a flexible circuit electrical connector the necessary metal for effecting welding attachment of the flexible circuit by application of laser heat is provided. By removing some or substantially all the balance of the metal band in the process of manufacture, the theoretical problem of undue stiffness resulting from the metal band attachment to the laminate is obviated. By selective removal of the encapsulant resin to expose the normally covered laminated surface of the metal band portion to be weld-attached, laser welding is readily accomplished without damage to the encapsulant or the conductors therein, and reverse side welding, i.e. from the flexible circuit electrical connector is facilitated. In preferred modes of the invention, the encapsulant is also partially removed to furnish a port for application of cooling gases during welding.

With reference to the drawings, FIGS. 1, 1A, 1B and 2 show a disk drive suspension 10 adapted to be fixed by mounting plate 8 to an actuator arm (not shown) and comprising a load beam 12, a flexure 14 and flexible circuit electrical connector 22. The load beam 12 has a base portion 12a to which the mounting plate 8 is attached, spring portion 12b and a rigid portion 12c having edge rails 12d. The flexure 14 comprises flexure body 20 apertured at 14b to form outrigger arms 14c, 14d and a gimballing tongue 14e movable between the arms and to which a slider may be attached. Flexure outrigger arms 14c, 14d are supported by outrigger tabs 16, 18 extending laterally from the flexure body 20.

In accordance with the invention, flexible circuit electrical connector 22 is not adhesively attached but is weld-attached to the load beam 12 and/or the flexure 14. In the illustrated embodiment of FIGS. 1, 1A, 1B and 2, the electrical connector 22 is weld-attached to the load beam 12 at attachment locus 24 and to the flexure 14 at its outrigger tabs 16, 18 at their respective loci 25, 26.

For purpose of attachment a flexible circuit electrical connector 22 is used that comprises a conductive layer 30 comprising an insulating resin encapsulant 34, e.g. a polyimide resin, and multiple conductors 36. The connector 22 also includes a metal band layer 32. See FIG. 2. The encapsulating resin 34 that encapsulates the conductors 36 may encapsulate the metal band layer 32 as well. The metal band layer 32 is laminated to the conductive layer 30 by a suitable resin adhesive, such as the encapsulating resin 34 itself surrounding and insulating the multiple conductors 36, or another adhesive. Laminate and its cognitives herein refer to the bonded condition of two layers whether those layers are coextensive or not. Thus, while it is preferred to have at least initially the metal band layer 32 and the conductive layer 36 coextensive, it is possible to have only portions of the metal band layer at the outset of manufacture as well as at its conclusion and still achieve the purposes of the invention.

Laser welding of the electrical connector 22 and the load beam 12 and/or flexure 14 requires that there be the equivalent of welding flux at the interface of the parts to be welded. In accordance with the invention, that necessary material can be found in suitably dimensioned portions 38 of the metal band layer 32. To realize portions 38 from the electrical connector 22, the connector is selectively etched leaving primarily the portions 38 in areas to be described and removing substantially the entire balance of the metal band layer 32 from the conductive layer 30, that is, not more than 10–20% of the original layer 32 will remain and at least 90% of that, areally speaking, will be in the portions 38.

Figure 1A:
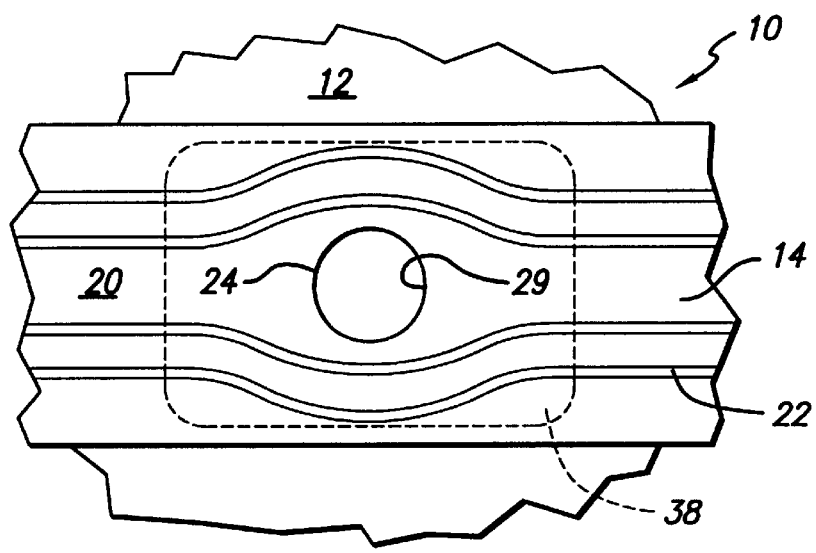
FIG. 1A is a view taken on line 1A in FIG. 1.
Figure 1B:
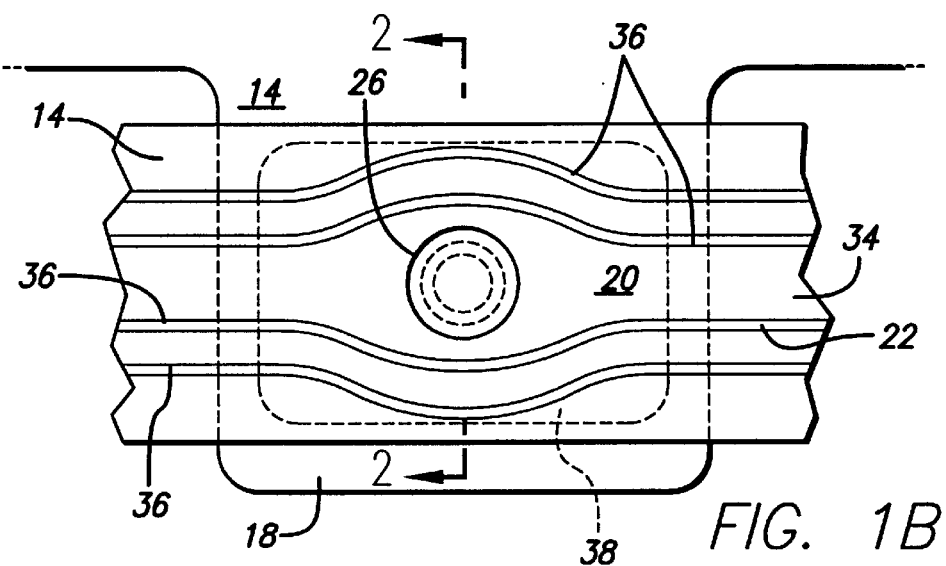
FIG. 1B is a view taken on line 1B in FIG. 1.
Figure 2:
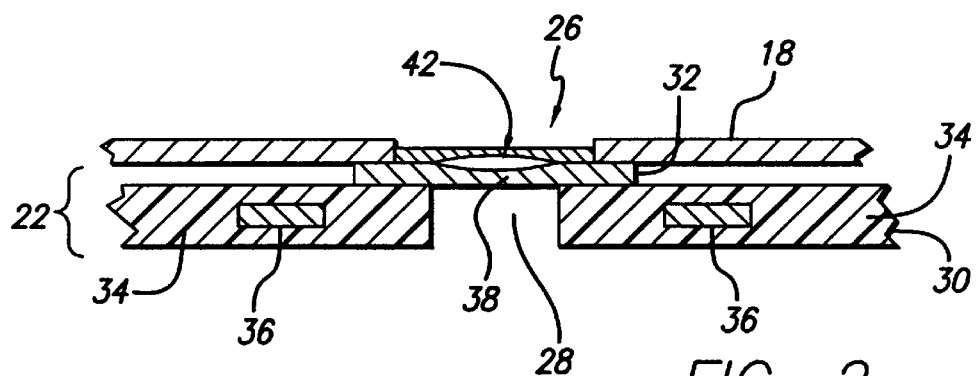
FIG. 2 is a view in cross-section of the weldment of the flexible circuit to the flexure tab, taken on line 2—2 in FIG. 1B and inverted.

It may be desirable to remove or reshape the insulating resin encapsulant 34 from the intended area of welding to facilitate cooling in the area for example, and to avoid damage to conductors 36 and the encapsulant 34 immediately surrounding the conductors. In FIGS. 1B and 2 the encapsulant 34 has been reshaped to provide an aperture 28 between pairs of multiple conductors 36 and to expose the locus of weld attachment 26 on flexure outrigger 18. The electrical connector 22 is similarly reshaped as shown in FIG. 1A to form aperture 29 at the load beam locus 24 of weld attachment.

With particular reference to FIG. 2, which is illustrative of all such connections of load beam 12 and flexure 14, the remnant portion 38 of the metal layer 32 is registered with the welding attachment locus 26 defined by flexure outrigger tab 18 as the load beam and flexure are juxtaposed in the desired relation. The encapsulant resin aperture 31 is also registered with the welding attachment locus 26. A laser beam is directed at the assembly from either above or below; See FIGS. 3 and 4. Advantageously with the present invention, the welding of the flexible circuit electrical connector 22 to the load beam 12 or flexure 14 is achievable from either side of their assembly, and, particularly advantageously, from the flexible circuit-bearing side of the assembly. As shown in FIG. 2, the metal layer portion 38 is locally fused to form weldment 42 that joins the portion 38 to the flexure outrigger tab 18. It will be noted that the outrigger tab 18 is of a reduced thickness opposite the weld attachment locus 26 and that this reduced thickness area is also partly fused by the laser welding action in forming weldment 42. The conductive layer 30 being already adhesively joined to the metal layer portion 38 is thus attached to the flexure outrigger tab 18.

Figure 3:
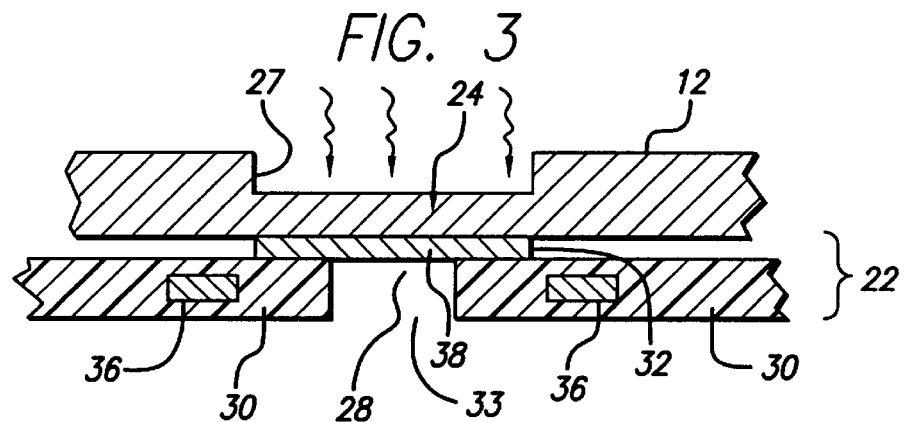
FIG. 3 is a view in cross-section of the flexible circuit and load beam juxtaposed for laser welding from the load beam side of the assembly, the dimensioned metal layer portion being between the load beam and the flexible circuit conductive layer.
Figure 3A:
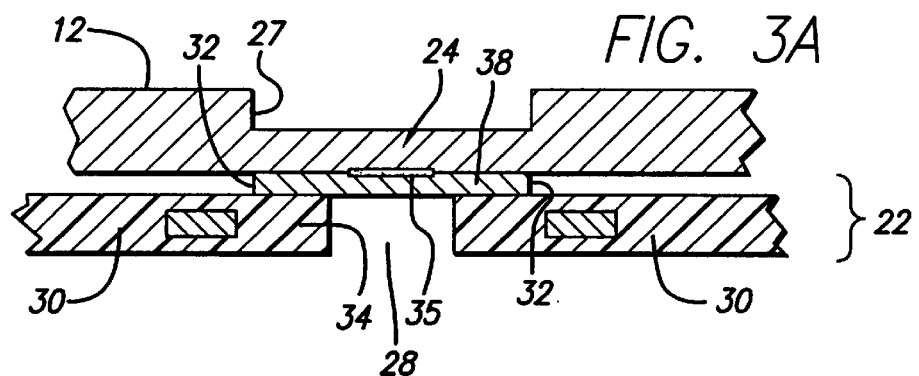
FIG. 3A is a view in cross-section of the weldment of the flexible circuit to the load beam.

With reference now to FIGS. 3, 3A, 4, and 4A, in which like parts have like numbers to the other Figures, in FIGS. 3 and 3A the load beam 12 is juxtaposed with the flexible circuit electrical connector 22 from which the metal layer 32 has been removed, save portion 38, which portion is dimensioned as shown to be opposite only to the weld-attachment locus 24 and substantially coextensive only with that locus. The load beam 12 is reduced in cross-section at etched relief 27 to facilitate laser welding with a suitable energy input (shown schematically in FIG. 3) by offering a thinner wall for faster heat penetration to the metal layer portion 38. The opposing encapsulant 34 aperture 28 provides a port 33 that allows for the delivery of cooling gas during welding to minimize weld burn. The resulting weldment 35 is depicted in FIG. 3A.

The weldment 35 area is not narrowly critical and, in general, will be sufficient to join the load beam 12 to the metal layer portion 38 and thus join the electrical connector 22 to the load beam. Excessive weldment 35 area is to be avoided as requiring excessive heat input into the load beam 12 and connector 22. In preferred modes, not more than 10–20% of the original metal band layer 32 will remain on the connector 22, and about 90% of that will be in the portions 38 used to attach the connector to the load beam or flexure. The areas of weldment 35, then, relative to the locus in which the weldment is placed, will range from 5 to 50% of the locus. For this purpose the locus 24 will be considered the area opposite the relief 27 of the load beam 12.

Figure 4:
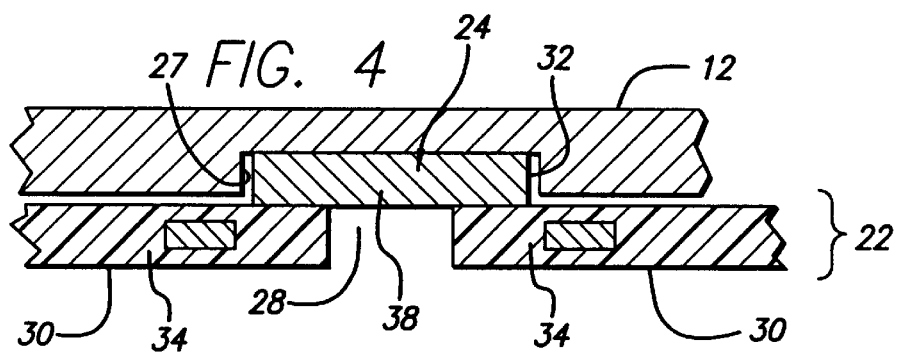
FIG. 4 is a view in cross-section of the flexible circuit and load beam juxtaposed for laser welding from the flexible circuit side of the assembly, the dimensioned metal layer portion being within a relief recess in the load beam; and, FIG. 4A is a view in cross-section of a weldment of the flexible circuit to the load beam.
Figure 4A:
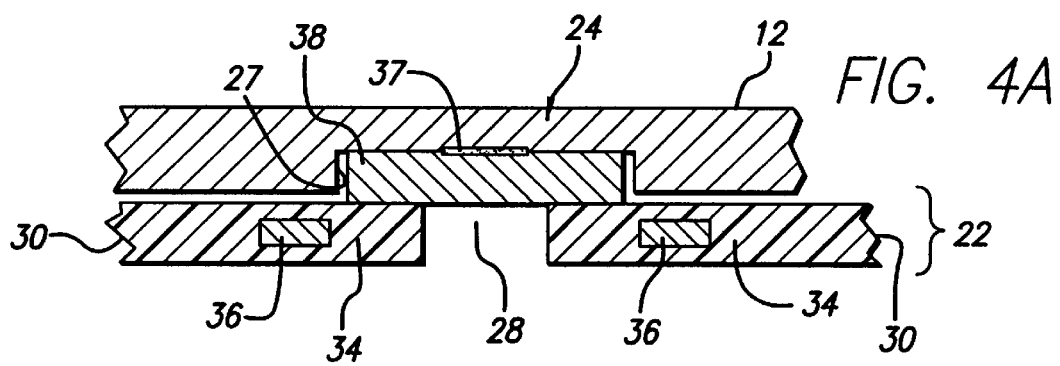

In FIGS. 4 and 4A, the flexible circuit electrical connector 22 is attached to the load beam 12 by incorporating the metal band layer portion 38 into the relief 27 of the load beam. A reduced thickness is thus provided in the load beam for laser welding, as before, but reversed to be open to and oppose the portion 38. This will afford a somewhat lower profile than the FIG. 3 embodiment, and is advantageous also for permitting laser energy application from the flexible circuit electrical connector 22 side of the assembled load beam 12 and connector. A weldment 37 results, FIG. 4A.

The attachment of the connector 22 by a metal band portion 38 to the flexure tabs 16, 18 is readily seen to simply follow the just described load beam attachment procedure.

The invention thus provides an improved disk drive suspension using flexible circuit electrical connector welded to the suspension load beam and/or flexure rather than adhered with synthetic organic resin adhesive, and thereby avoids potential outgassing problems. The invention further provides a modified flexible circuit electrical connector with a minimum base layer for minimum stiffness that is a source of weld material; substantially the balance of the band being removed, and permits laser welding of the load beam and flexure to the connector from either side thereof, and particularly from the flexible circuit-bearing side of the combination, all while obviating the use of adhesives to join the flexible circuit connector and the load beam and/or flexure.

I claim:

1. A disk drive suspension comprising a load beam, a flexure attached to the load beam for carrying a slider in operating proximity to a disk, and a laminated flexible circuit electrical connector comprising a conductive layer having a plurality of conductors encapsulated with insulating resin and a metal band base layer to which said conductive layer is laminated, said load beam defining a locus of weld attachment to said electrical connector, said electrical connector metal band base layer being reduced to a portion dimensioned to be opposite only said weld attachment locus and substantially coextensive only therewith for weld attachment of said electrical connector to said load beam by welding said metal band base layer portion laminated to said encapsulated conductors to said load beam, substantially the balance of said electrical connector being free of said metal band base layer.

2. The disk drive suspension according to claim 1, in which said load beam has a reduced cross-section at said locus of weld attachment in laser welding facilitating relation.

3. The disk drive suspension according to claim 1, in which said electrical connector defines a port for cooling gas delivery proximate to said weld attachment locus.

4. The disk drive suspension according to claim 1, in which said electrical connector is welded to said load beam at said weld attachment locus.

5. A disk drive suspension comprising a load beam, a flexure attached to the load beam for carrying a slider in operating proximity to a disk, and a laminated flexible circuit electrical connector comprising a conductive layer having a plurality of conductors encapsulated with insulating resin and a metal band base layer to which said conductive layer is laminated, said flexure defining a locus of weld attachment to said electrical connector, said electrical connector metal band base layer being reduced to a portion dimensioned to be opposite only said weld attachment locus and substantially coextensive only therewith for weld attachment of said electrical connector to said load beam by welding said metal band base layer portion laminated to said encapsulated conductors at said locus to said flexure, substantially the balance of said electrical connector being free of said metal band base layer.

6. The disk drive suspension according to claim 5, in which said electrical connector defines a port for cooling gas delivery proximate to said weld attachment locus.

7. The disk drive suspension according to claim 5, in which said load beam has a reduced cross-section at a second locus of weld attachment in laser welding facilitating relation.

8. A disk drive suspension comprising a load beam, a flexure attached to the load beam for carrying a slider in operating proximity to a disk, and a laminated flexible circuit electrical connector comprising a conductive layer having a plurality of conductors encapsulated with insulating resin and a metal band base layer to which said conductive layer is laminated, said load beam and said flexure each defining a locus of weld attachment to said electrical connector, said electrical connector metal band base layer being reduced to portions dimensioned to be opposite only each said weld attachment locus and substantially coextensive only therewith for weld attachment of said electrical connector to said load beam and flexure by welding said metal band base layer portions laminated to said encapsulated conductors to said load beam and said flexure, substantially the balance of said electrical connector being free of said metal band base layer.

9. The disk drive suspension according to claim 8, in which said electrical connector conductive layer insulating resin encapsulant is locally apertured adjacent said metal band base layer portion freely of interruption of said conductors and their insulating resin encapsulation.

10. The disk drive suspension according to claim 9, in which said locally apertured insulating resin encapsulant defines a port for cooling gas delivery proximate to each said weld attachment locus.

11. The disk drive suspension according to claim 8, in which said electrical connector is welded to said load beam at said load beam weld attachment locus.

12. The disk drive suspension according to claim 11, in which the area of one of said metal band base layer portions is not more than five times the area of the weld between said metal band base layer and said load beam at said load beam locus of weld attachment.

13. The disk drive suspension according to claim 12, in which said load beam has a reduced cross-section at said load beam locus of weld attachment in laser welding facilitating relation.

14. The disk drive suspension according to claim 13, in which said load beam reduced cross section is defined by a surface recess in said load beam.

15. The disk drive suspension according to claim 14, in which said load beam recess opens toward and receives said one of said metal band base layer portions for weld attachment to said load beam.

16. The disk drive suspension according to claim 14, in which said load beam recess opens away from said one of said metal band base layer portions.

17. A load beam and flexure combination with a flexible circuit, said flexible circuit having at least one laminated pad of metal band base layer dimensioned for welding to a load beam or flexure, said flexible circuit being weld-attached to either or both of said load beam and said flexure, said pad having an area not exceeding five times the area of said weld.

18. The load beam and flexure combination according to claim 17, in which said flexure has laterally projecting tabs, said tabs supporting said flexible circuit in weld-attached relation.

19. The load beam and flexure combination according to claim 18, in which said load beam and said flexure tabs define plural weld attachment loci, said flexible circuit comprises a conductive layer of mu conductors encapsulated in an insulating resin laminated to said at least one pad, said at least one pad being located opposite each of said weld attachment loci in laser-weldable relation.

20. The load beam and flexure combination according to claim 19, in which said flexible circuit along the length of said flexure is free of metal layer laminate other than at said loci of weld attachment.

* * * * *